United States Patent [19]

Price

[11] 4,135,295

[45] Jan. 23, 1979

[54] PROCESS OF MAKING PLATINUM SILICIDE FUSE LINKS FOR INTEGRATED CIRCUIT DEVICES

[75] Inventor: William L. Price, Saratoga, Calif.

[73] Assignee: Advanced Micro Devices, Inc., Sunnyvale, Calif.

[21] Appl. No.: 807,806

[22] Filed: Jun. 20, 1977

Related U.S. Application Data

[62] Division of Ser. No. 662,340, Mar. 1, 1976, Pat. No. 4,042,950.

[51] Int. Cl.² .......................................... H01H 69/02
[52] U.S. Cl. .................................. 29/623; 29/578; 357/51
[58] Field of Search .................. 29/578, 623, 620; 357/51, 67, 85, 68

[56] References Cited

U.S. PATENT DOCUMENTS

| | | | |
|---|---|---|---|
| 3,287,612 | 11/1966 | Lepselter | 29/578 X |
| 3,335,338 | 8/1967 | Lepselter | 357/34 X |
| 3,590,471 | 7/1971 | Lepselter | 29/578 X |
| 3,783,506 | 1/1974 | Pelfield | 29/623 |
| 3,792,319 | 2/1974 | Tsang | 357/23 |

Primary Examiner—Leon Gilden

[57] ABSTRACT

Selected circuit elements and interconnections of an integrated circuit device are connected by platinum silicide fuse links which open when electrical power exceeds a threshold amount. The fuse is constructed by defining the fuse geometry in a polycrystalline silicon layer over a wafer substrate, depositing a layer of platinum thereover and then sintering the platinum into the polysilicon.

2 Claims, 4 Drawing Figures

PROCESS OF MAKING PLATINUM SILICIDE FUSE LINKS FOR INTEGRATED CIRCUIT DEVICES

CROSS REFERENCE TO RELATED APPLICATION

This is a division of application Ser. No. 662,340, filed Mar. 1, 1976, now U.S. Pat. No. 4,042,950 granted Aug. 16, 1977.

BACKGROUND OF THE INVENTION a. Field of the Invention

The invention relates to solid state devices and more particularly to a method for making fuse useful in integrated circuit construction.

b. Prior Art

Proliferation of semiconductor programmable read-only memories (PROMs), utilizing integrated circuit technology, has led to the use of PROMs in a large number of diverse applications including control of integrated circuit microprocessors, character generation, code conversion, table look-up, arithmetic logic and other control functions. In the prior art, one method of programming PROMs is by means of a fusable link which connects memory cells to reading logic. The following U.S. patents all show fuse links of the prior art: U.S. Pat. Nos. 3,564,354; 3,619,725; 3,699,395; 3,699,403; 3,733,690; 3,742,592; 3,792,319; and 3,848,238.

In prior art fuses, the fuse material has often been polycrystalline silicon or nichrome. A problem with polycrystalline silicon is that it requires a relatively large fusing current, while the problem with nichrome is one of reliability, i.e. after blowing a nichrome fuse, molten nichrome may reform, making a current path between regions where the fuse was blown. These, as well as other problems with other prior art fuses led me to search for new fuse materials.

In my prior work, I had utilized platinum in the metallization scheme for making interconnections in the formation of integrated circuits. Indeed, several U.S. patents teach the use of platinum silicide in the metallization and contact plan for the construction of integrated circuit devices, including Schottky diodes. These patents include U.S. Pat. Nos. 3,261,075; 3,426,252; 3,449,825; 3,753,807; 3,540,010; 3,558,366.

Because of the problems with prior art fuse materials, it was the object of this invention to devise a fusable link for integrated circuit construction which had greater reliability than nichrome fuses of the prior art, and had lower fusing current than polycrystalline silicon fuses of the prior art and could be manufactured in the same processing step as other integrated circuit devices or portions thereof.

SUMMARY OF THE INVENTION

The above object was achieved with the discovery that an integrated circuit fuse link could be made by forming a fuse of polycrystalline silicon combined with a thin layer of platinum, by sintering. By using polycrystalline silicon a diffusion step was eliminated and a fuse is formed in the same processing step as transistor contacts and Schottky diodes. The resulting fuse opens at a lower current than a comparable polycrystalline silicon fuse of the prior art and has greater reliability than nichrome fuses.

DESCRIPTION OF THE PREFERRED EMBODIMENT

Previously in this application, reference has been made to the use of fuse links in PROMs. While such use is the predominant use of fuse links, there are other possible applications for fusable links and the description herein is not intended to be limited to the use of fuse links in PROMs. Such use is merely exemplary.

Figure 1:
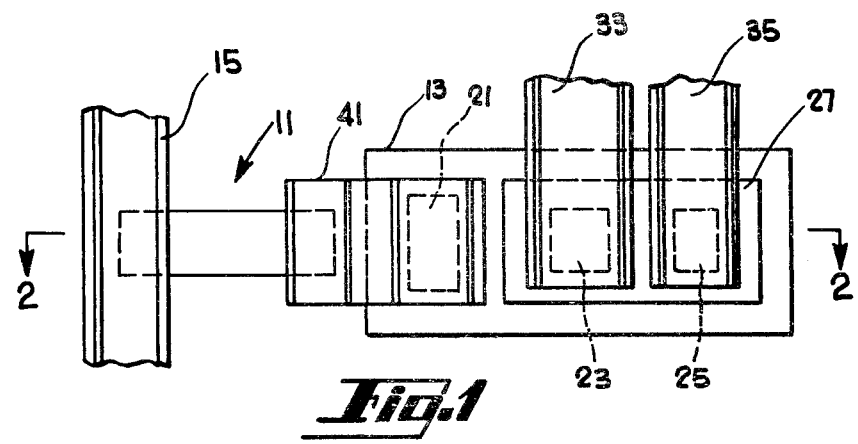
FIG. 1 is a top plan view showing a fuse construction in accord with the present invention.

In FIG. 1, a fusable link 11 is shown connecting a Schottky diode and a transistor in a substrate 13 connected to a metal bus line 15, a conductive member. Substrate 13 includes a Schottky diode contact 21 and emitter region 23 and a base contact region 25 of a transistor having a buried collector, not shown. Oxide 27 surrounds the emitter contact 23 and the base contact 25 which are in electrical communication with respective emitter and base regions of a transistor defined in substrate 13. Emitter metallization 33 and base metallization 35 are metal connections for operating the transistor of substrate 13 through electrical communication with emitter contact 23 and base contact 25, respectively. Similarly, a metal connector 41 is deposited over the Schottky diode contact 21. The platinum silicide fuse 11 of the present invention is constructed between the metal connector 41 and the metal bus line 15, by means of the construction described below.

EXAMPLE 1

Figure 2:
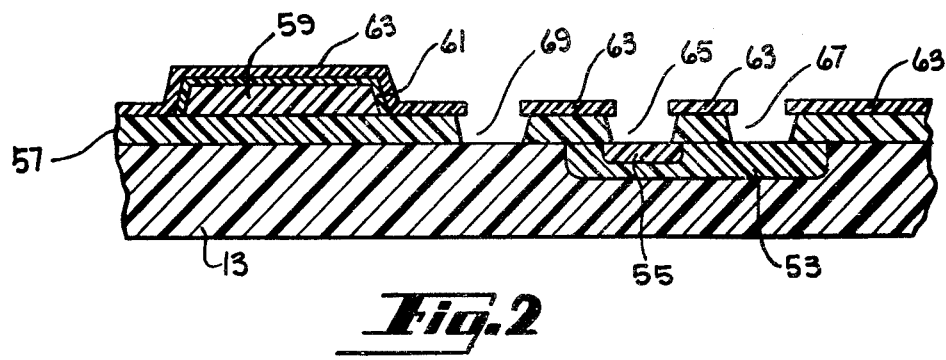
FIG. 2 is a side sectional view taken along lines 2—2 in FIG. 1, at an early stage of construction.

With reference to FIG. 2, a silicon wafer substrate 13 includes a base 53 formed by diffusion into the substrate 13 through masks, in a well-known manner. A buried collector is not shown. Subsequently, a layer of oxide 57 is grown completely across the substrate 51 in a known manner. Next, a layer of polycrystalline silicon 59 is deposited on the oxide completely over the substrate either by means of chemical vapor deposition or by evaporation. The thickness of the polycrystalline silicon should be at least 1.5 times the thickness of platinum which will eventually be used. The poly silicon is oxidized to facilitate fuse masking (approximately 200A°).

In the next step the fuse pattern is established by masking over the polycrystalline silicon. By means of a well-known photoresist process, polycrystalline silicon is removed by means of oxide etch followed by a silicon etch from all areas except where the fuse exists. The approximate thickness of the polysilicon is 2500 angstroms, while the approximate width is $2\mu$ and the approximate length is $8\mu$ plus a metal overlap on each end. The minimal cross sectional dimension of the fuse is one which allows the fuse to blow or electrically open when electrical power through the fuse exceeds a preselected threshold power.

In stating that the polycrystalline silicon thickness should be at least 1.5 times greater than the platinum thickness an important criterion is established that an excess amount of polycrystalline silicon is provided with reference to the amount of platinum which will combine with the silicon. The excess silicon is provided to prevent aqua regia from etching the fuse when aqua regia is used for subsequent etching operations.

Next, a thin oxide layer 61, approximately 100 angstroms, may be grown on the polysilicon fuse geometry by thermal oxidation. This oxide may be required to prevent attack of the poly silicon during removal of the silicon nitride. Next, a silicon nitride layer 63 is deposited completely over the substrate including the fuse. Next the substrate is masked and etched for combinations of contacts by cuts into the silicon nitride, thereby exposing underlying oxide. Then, in another masking and etching operation, oxide is removed from the region 65 where an emitter is to be formed. Emitter 55 is then diffused through opening 65 by a standard diffusion method.

Next, oxide is removed from all contact regions, such as the base contact region 67 and the Schottky diode contact region 69 by means of a masking and etching operation.

Next, the silicon nitride layer 63 is removed and oxide layer 61 is removed from the fuse, if initially grown, as well as any oxide which is built up over emitter region 55.

Next, a thin layer of platinum is sputtered or vapor deposited to a thickness of between 200 and 1,000 angstroms over the entire surface. The platinum layer is then reacted with the exposed silicon at regions on top and sides of fuses, emitters and all contact regions by means of sintering at 560° C. for approximately 20 minutes in a nitrogen atmosphere.

Figure 3:
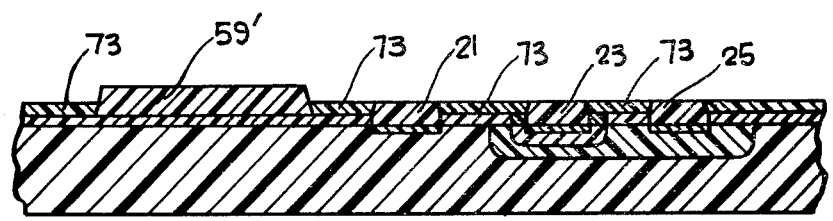
FIG. 3 is another view of the construction of FIG. 2, at an intermediate stage of completion.
Figure 4:
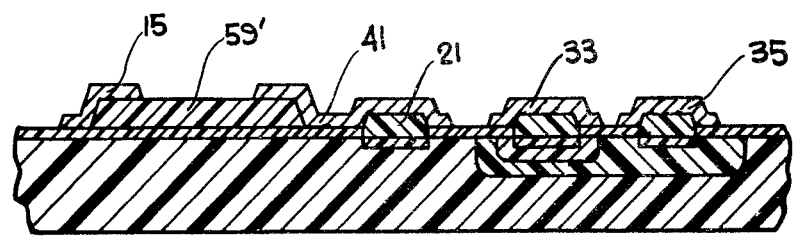
FIG. 4 is the apparatus of FIG. 2 near the final stage of construction.

In FIG. 3, the polysilicon layer 59 of FIG. 2 has been reacted with platinum to form the platinum silicide fuse 59'. Additionally platinum silicide contact regions 21, 23, 25 exist for a Schottky diode, an emitter contact and a base contact, respectively. Next, unreacted platinum 73 is etched off with aqua regia in order to remove excess platinum. Then, the entire device is metallized and then the metallization is removed in a masking and etching process to form desired interconnections. In FIG. 4, metallization for fuse 59' includes the bus line 15 of FIG. 1, as well as the Schottky metal connector 41, the emitter metallization 33 and the base metallization 35. This completes the formation of the fuse contemplated in the present invention in combination between a transistor-Schottky diode structure on the one hand and a metal bus line on the other hand.

EXAMPLE 2

If a transistor is to be connected to a bus line by means of a fuse, as with the prior example, but it is desired to omit the Schottky diode previously discussed, a substrate is completed as previously described through the step of emitter diffusion. The steps which follow are the deposition of polycrystalline silicon over the substrate and then the formation of the fuse geometry by masking and etching. Platinum is then deposited as previously described, reacted and etched. At this point device contacts are defined and the remaining operations are performed as previously described. The difference with respect to the prior example is that device contacts are formed subsequent to sintering platinum with silicon, rather than before the sintering operation as when Schottky diodes are formed.

EXAMPLE 3

This example involves a shallow emitter process without Schottky diodes. In this process, a substrate is prepared as mentioned in the first example to the point of being ready for an emitter mask. Polycrystalline silicon is deposited as previously described, fuse shapes are defined by masking and etching, following by definition of emitters by masking, followed by diffusion of emitters. Next, emitters are washed, in the so-called washed emitter process. Next, platinum is deposited and reacted with polysilicon, with the remainder being etched away. The next step involves the definition of contact openings for bases. Next the wafers are processed as in the first example. As a general rule, superior fuse properties are obtained with fuses thin in the vertical direction because better step coverage exists, i.e. the fuse follows the step contour better, minimizing structural weakness.

It will be realized that the platinum silicide fuses of the present invention result in smaller fuses because there is no need for enlarged ends for contact metallization, since the contacts for metallization are formed in the same step as the fuse. Construction of fuses is simplified because the contacts for the bases, emitters and Schottky's are formed in the same step as that in which fuses are completed. With the present apparatus, fusing yield is higher because less power is needed to open or blow the fuse due to lower melting temperatures.

The processing steps for platinum silicide fuses described herein are adaptable to various integrated circuit construction techniques, including composite masking processes.

In Example 1, given above, use of a nitride layer was indicated. Use of nitride permits composed masking wherein masking which was previously done in two steps may be done in a single step. For example, contacts and emitters may be formed in the same masking step.

Previously, where platinum silicide was not desired, use of silicon nitride was restricted. However, here, wherein platinum silicide is utilized, silicon nitride is useful, if not necessary, in composed mask formation. This is another advantage of platinum silicide fuses.

I claim:
1. In a process for making fusing links in integrated circuit construction including the steps of providing a suitable substrate, forming circuit regions, the improvement comprising,
   depositing a polycrystalline silicon layer over said substrate,
   defining fuse geometry in said polycrystalline silicon layer by masking and etching,
   depositing a platinum layer onto said fuse geometry,
   thermally reacting said platinum with said polycrystalline silicon, thereby forming platinum silicide fuses, and
   removing excess platinum.
2. The process of claim 1 further defined by depositing said platinum layer onto said fuse geometry to a thickness at least 50% thinner than the thickness of the polycrystalline fuse layer.

* * * * *